United States Patent [19]
Chiang et al.

[11] Patent Number: 6,025,461
[45] Date of Patent: Feb. 15, 2000

[54] PHOTOSENSITIVE POLYIMIDE

[75] Inventors: Lin-Chiu Chiang; Jeng-Tain Lin, both of Kitaibaraki, Japan

[73] Assignee: Nippon Mektron, Limited, Tokyo, Japan

[21] Appl. No.: 09/129,581

[22] Filed: Aug. 5, 1998

[30] Foreign Application Priority Data

Sep. 26, 1997 [JP] Japan .................................. 9-279959

[51] Int. Cl.$^7$ .................................................. C08G 73/10
[52] U.S. Cl. .............................. 528/353; 528/26; 528/38; 528/125; 528/128; 528/171; 528/172; 528/173; 528/174; 528/183; 528/188; 528/220; 528/229; 528/350
[58] Field of Search ...................... 528/353, 125, 528/128, 172, 38, 173, 26, 174, 171, 183, 220, 188, 229, 350

[56] References Cited

U.S. PATENT DOCUMENTS

| | | | |
|---|---|---|---|
| 4,861,854 | 8/1989 | Sugio et al. | 528/353 |
| 5,177,181 | 1/1993 | Rosenfeld et al. | 528/353 |
| 5,189,115 | 2/1993 | Melquist | 528/353 |
| 5,300,627 | 4/1994 | Kunimune et al. | 528/173 |
| 5,310,862 | 5/1994 | Nomura et al. | 528/26 |
| 5,859,181 | 1/1999 | Zhao et al. | 528/173 |
| 5,866,627 | 2/1999 | Czornyj et al. | 528/353 |

FOREIGN PATENT DOCUMENTS

| | | |
|---|---|---|
| 0 517 002 | 12/1992 | European Pat. Off. . |
| 37 03 167 | 8/1987 | Germany . |
| 57-131227 | 8/1982 | Japan . |
| 59-145216 | 8/1984 | Japan . |
| 64 000123 | 1/1989 | Japan . |

OTHER PUBLICATIONS (SPIE vol. 1086, Advances in Resist Technology & Processing VI, pp. 396–405 (1989). The month in the date of publication is not available.

*Primary Examiner*—P. Hampton-Hightower
*Attorney, Agent, or Firm*—Barnes & Thornburg

[57] ABSTRACT

A photosensitive polyimide, which comprises a copolymer of (A) three diamine compounds mixture consisting of a diaminopolysiloxane, a hydroxyl group-containing diamine or carboxyl group-containing diamine and 1,4-bis[2-(3-aminobenzoyl)ethenyl]benzene with (B) an aromatic tetrocarboxylic acid dianhydride or a dicarboxylic anhydride having a 2,5-dioxotetrahydrofuryl group as one acid anhydride group, is soluble in all-purpose low boiling organic solvents, typically methyl ethyl ketone and provides a negative type photosensitive polyimide, which is developable with an aqueous alkaline solution.

7 Claims, No Drawings

PHOTOSENSITIVE POLYIMIDE

BACKGROUND OF THE INVENTION

1. Field of the Invention

The present invention relates to a photosensitive polyimide and more particularly to a photosensitive polyimide soluble in all-purpose low boiling organic solvents and aqueous alkaline solution.

2. Related Art

Polyimide resins per se are insoluble in organis solvents and thus it is synthesized by the common practice to convert to organic solvent-soluble polyamic acids at first and then conduct polyimidization thereof. Some of polyimide resins are per se soluble in organic solvents. For example, it is said that polyimide resins disclosed in JP-A-57-131227 and polyimideamide resins disclosed in JP-A-59-145216 are soluble in organic solvents and also are photosensitive. However, the organic solvents as mentioned therein are aprotic polar solvents including dimethylformamide. On the contrary, acetone, benzene, cyclohexanol, etc. are used to precipitate the resins. That is, the resins are insoluble in these organic solvents.

SUMMARY OF THE INVENTION

An object of the present invention is to provide a negative type photosensitive polyimide, which is photosensitive per se and can be developed by an aqueous alkaline solution, and soluble in all-purpose low boiling organic solvents, typically methyl ethyl ketone.

The object of the present invention can be attained by a photosensitive polyimide, which comprises a copolymer of (A) three diamine compounds mixture consisting of a diaminopolysiloxane, a hydroxyl group-containing diamine or carboxyl group-containing diamine and 1,4-bis[2-(3-aminobenzoyl)ethenyl]benzene with (B) a tetracarboxylic acid dianhydride.

DETAILED DESCRIPTION OF THE INVENTION

For a diaminopolysiloxane, which is the first member of the diamine compound mixture reactive with a tetracarboxylic acid dianhydride, a compound represented by the following general formula can be used:

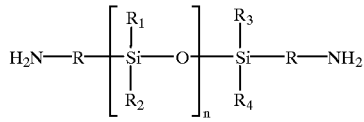

where R respresents a divalent hydrocarbon group having 2 to 6 carbon atoms, preferably 3 to 5 carbon atoms; $R_1$ to $R_4$ each independently represent a lower alkyl group having 1 to 5 carbon atoms or a phenyl group; and n represents an integer of 0 to 30, preferably 4 to 12.

The compound includes, for example, compounds having R and $R_1$ to $R_4$ in the following combinations:

| R | $R_1$ | $R_2$ | $R_3$ | $R_4$ |
| --- | --- | --- | --- | --- |
| $(CH_2)_3$ | $CH_3$ | $CH_3$ | $CH_3$ | $CH_3$ |
| $(CH_2)_4$ | $CH_3$ | $CH_3$ | $CH_3$ | $CH_3$ |
| $(CH_2)_3$ | $CH_3$ | $C_6H_5$ | $CH_3$ | $C_6H_5$ |
| $p-C_6H_4$ | $CH_3$ | $CH_3$ | $CH_3$ | $CH_3$ |

In practice, such commercially available products as TSL9386, TSL9346 and TSL9306 products available from Toshiba Silicone K.K., Japan), BY16-853U product available from Toray-Dow Corning K.K., Japan), X-22-161AS (product available from Shinetsu Kagaku Kogyo K.K., Japan), F2-053-01 (product available from Nihon Unicar K.K., Japan), etc. can be used.

For a hydroxyl group-containing diamine or carboxyl group-containing diamine as the second member of the diamine compounds mixture, for example, 4,4'-diamino-4"-hydroxytriphenyl methane, bis(4-amino-3-hydroxyphenyl) methane, 2,2-bis(3-amino-4-hydroxyphenyl)propane, 3,5-diaminobenzoic acid, etc. can be used.

For the third member of the diamine compound mixture, 1,4-bis[2-(3-aminobenzoyl)ethenyl]benzene, represented by the following formula, can be used to give a photosensitivity to the resulting copolymer:

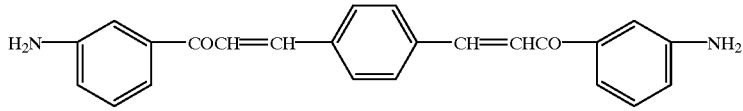

Among these three members of the diamine compounds mixture, the diaminopolysiloxane can be used in a proportion of about 20 to about 60% by mole, preferably about 30 to about 50% by mole; the hydroxyl group-containing diamine or carboxyl group-containing diamine can be used in a proportion of about 20 to about 60% by mole, preferably about 30 to about 50% by mole; and the 1,4-bis[2-(3-aminobenzoyl)ethenyl]benzene can be used in a proportion of 5 to 40% by mole, preferably about 10 to about 30% by mole, on the basis of the diamine compounds mixture. When the diaminopolysiloxane is in a proportion of less than about 20% by mole, no films are formed, whereas above about 60% by mole, no development by an aqueous alkaline solution can be attained. When the hydroxyl group-containing diamine or carboxyl group-containing diamine is used in a proportion of less than about 20% by mole, the non-light exposed parts become insoluble in an aqueous alkaline solution,whereas above about 60% by mole even the light-exposed parts are soluble in an aqueous alkaline solution, but a difference in dissolution rate between the light-exposed parts and the non-light exposed parts becomes smaller. When the 1,4-bis[2-(3-aminobenzoyl)ethenyl]benzene is in a proportion of less than about 5% by mole, no satisfactory photosensitivity can be obtained, whereas above about 40% by mole the transparency will be deteriorated.

For a tetracarboxylic acid dianhydride reactive with the diamine compounds mixture, an aromatic tetracarboxylic acid anhydride such as 3,3',4,4'-benzophenonetetracarboxylic acid dianhydride, 3,3',4,4'- diphenylsulfonetetracarboxylic add dianhydride, 4,4'-oxydiphthalic acid dianhydride, 4,4'-biphthalic acid dianhydride, 2,2'-diphthalic acid dianhydride propane, diphthalic add dianhydride methane, pyromellitic acid dianhydride, 2,2'-(hexafluoroisopropylidene) diphthalic acid dianhydride or a dicarboxylic anhydride having a 2,5-dioxotetrahydrofuryl group as one acid anhydride group such as 5-(2,5-dioxotetrahydrofuryl)-3-metyl-3-cyclohexene-1,2-carboxylic acid anhydride

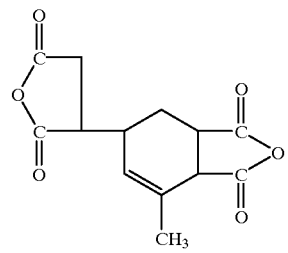

5-(2,5-dioxotetrahydrofuryl)-3-cyclohexene-1,2-carboxylic add anhydride, 4-(2,5-dioxotetrahydrofuran-3-yl)tetralin-1,2-carboxylic acid anhydride, can be used in an equimolar amount to the diamine compounds mixture.

Reaction of the diamine compound mixture with the tetracarboxylic acid dianhydride is carried out preferably in an aprotic polar solvent such as dimethylformamide, dimethylacetamide, N-methyl-2-pyrrolidone, etc., or also in a polar solvent such as cresol, pyridine, etc. In practice, the reaction is carried out by dropwise addition of the aromatic tetracarboxylic acid dianhydride into a polor sulvent solution of the diamine compounds mixture at about 0° to about 10° C. and then at an elevated temperature of about 50° to about 200° C., preferably about 100° to about 150° C. for about 2 to about 8 hours.

The reaction product is a polyamic acid as a polyimide precursor, and thus is to be subjected to dehydration reaction for polyimidizing the polyamic acid. Dehydration reaction, upon farther addition of a polar organic solvent to adjust the concentration to about 10 to about 20% by weight, if required, is carried out at about 100° to about 180° C. for about 2 to about 6 hours, preferably for about 2 to about 4 hours, preferably using a dehydrating agent such as acetic anhydride, etc.

When the hydroxyl group-containing diamine is, for example, 4,4'-diamino-4"-hydroxytriphenylmethane, siloxane polyimide as a polyimidization reaction product seems to be a block copolymer having repeating units (a), (b) and (c) represented by the following general formulae and having a weight average molecular weight Mw of about 10,000 to about 100,000, preferably about 15,000 to about 30,000 (as determined by GPC and in terms of polystyrene):

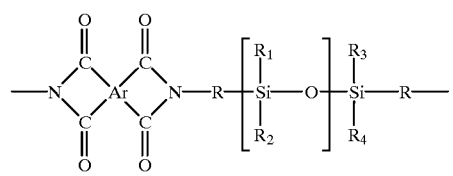

(a)

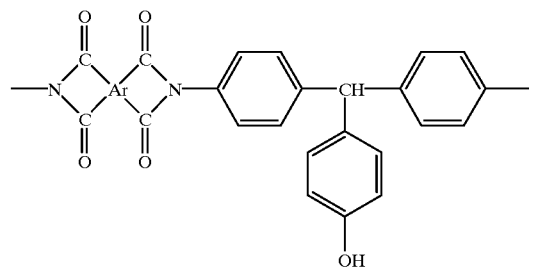

(b)

and

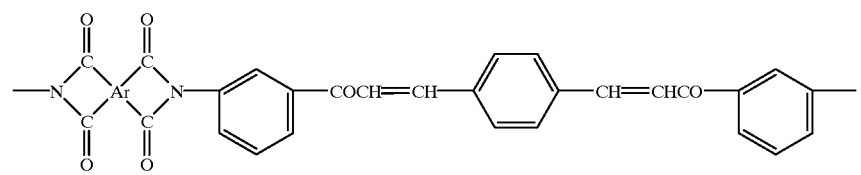

(c)

Ar: tetracarboxylic acid residue and

The resulting copolymers are soluble in a low boiling organic solvent such as acetone, methyl ethyl ketone, methyl isobutyl ketone, tetrahydrofuran, cyclohexanone, etc. and thus can be used as a ca. 20–40 wt. % solution, preferably a ca. 30–35 wt. % solution in the organic solvent. Such a solvent solution is trickled onto an alkali-resistant substrate such as a quartz glass plate, a copper plate, etc., followed by spin coating and prebaking at about 60° to about 80° C. for about 5 to about 10 minutes, thereby removing the solvent therefrom.

The resulting photosensitive polyimide-coated substrate, upon placing a necessary mask thereon, is irradiated with ultraviolet rays at an exposure dosage of about 200 to about 450 mJ/cm$^2$, preferably about 300 to about 450 mJ/cm$^2$ and then subjected to post-exposure baking at about 120° to about 140° C. for about 5 to about 10 minutes and then to development with an aqueous solution of an alkaline substance such as sodium carbonate, tetramethylammonium hydroxide, etc., whereby a clear, negative type pattern can be obtained on the substrate. Concentration of the developing solution is about 1 to about 5% by weight, preferably about 1 to about 3% by weight, and the developing time is preferably within about one minute.

According to the present invention, a negative type photosensitive polyimide, which is photosensitive per se and can be developed by an aqueous alkaline solution, and is soluble in an all-purpose low boiling organic solvent, can be provided.

PREFERRED EMBODIMENTS OF THE INVENTION

Polymerization Example 1

7.04 g (8 m moles) of aminopolysiloxane (BY 16-853U), 2.90 g (10 m moles) of 4,4'-diamino-4"-hydroxytriphenylmethane [DHTM], 0.736 g (2 m moles) of 1,4-bis[2-(3-aminobenzoyl)ethenyl]benzene [BABEB] and 30 g of N-methyl-2-pyrrolidone were charged into a separable flask having a capacity of 300 ml. The resulting solution was ice-cooled and, upon addition of 5.28 g (20 m moles) of 5-(2,5-dioxotetrahydrofuryl)-3-methyl-3-cyclohexene-1,2-dicarboxylic acid anhydride thereto, heated to 120° C. and stirred for 4 hours to conduct reaction. After the end of reaction, the reaction mixture was left standing for cooling to room temperature, then diluted with further 30 g of N-methyl-2-pyrrolidone to lower the polyamic acid concentration.

Furthermore, 5 g of pyridine and 10 g of acetic anhydride were added thereto and the reaction mixture was heated at 50° C. for 3 hours to conduct polyimidization reaction. After the end of reaction, the reaction mixture was reprecipitated in water, thereby obtaining a photosensitive polyimide.

Polymerization Example 2

In Polymerization Example 1, 2.112 g (8 m moles) of 2,2-bis(3-amino-4-hydroxy)propane was used in place of DHTM, and the amount of BABEB was changed to 1.472 g (4 m moles).

Polymerization Example 3

In Polymerization Example 1, 1.216 g (8 m moles) of 3,5-diaminobenzoic acid was used in place of DHTM, and the amount of BABEB was changed to 1.472 g (4 m moles).

EXAMPLE 1

About 2 g of a 35 wt. % solution in methyl ethyl ketone of the photosensitive polyimide obtained in Polymerization Example 1 was trickled onto a quartz glass plate (7×7 cm), followed by spin coating at 750 rpm for 10 seconds. Then, the solvent was removed therefrom by prebaking at 80° C. for 10 minutes. The photosensitive polyimide-coated quartz glass, upon placing a mask (PHOTEC, trademark of a product commercially available from Hitachi Chemical Co., Ltd., Japan) was irradiated with a UV light source having the main absorption at 350–450 nm (a product commercially available from Ushio Electric Inc., Japan) at an exposure dosage of 300 mJ/cm$^2$. After the exposure, post-exposure baking was carried out at 120° C. for 10 minutes, followed by development at 40° C. for about 60 seconds, using an aqueous 3 wt. % sodium carbonate solution as a developing solution and by washing with distilled water, whereby a dear, negative type pattern was obtained

Example 2

In Example 1, the photosensitive polyimide obtained in polymerization Example 2 was used in place of the photosensitive polyimide obtained in Polymerization Example 1, and the exposure dosage was changed to 475 mJ/cm$^2$. A clear, negative type pattern was likewise obtained.

Example 3

In Example 1, the photosensitive polyimide obtained in polymerization Example 3 was used in place of the photosensitive polyimide obtained in Polymerization Example 1. A dear, negative type pattern was likewise obtained.

What is claimed is:

1. A photosensitive polyimide, which comprises a copolymer of (A) three diamine compounds mixture consisting of a diamino polysiloxane, a hydroxyl group-containing diamine or a carboxyl group-containing diamine and 1,4-bix[2-(3-aminobenzoyl)ethenyl]benzene with (B) a tetracarboxylic acid dianhydride.

2. A photosensitive polyimide according to claim 1, wherein the diaminosiloxane is used in a proportion of 20 to 60% by mole on the basis of the diamine compound mixtures.

3. A photosensitive polyimide according to claim 1, wherein the hydroxyl group or carboxyl group-containing diamine is used in a proportion of 20 to 60% by mole on the basis of the diamine compound mixture.

4. A photosensitive polyimide according to claim 1, wherein the 1,4-bis[2-3(aminobenzoyl)ethenyl]benzene is used in a proportion of 5 to 40% by mole on the basis of the diamine compound mixture.

5. A photosensitive polyimide according to claim 1, wherein the tetracarboxylic acid dianhydride is an aromatic tetracarboxylic acid dianhydride.

6. A photosensitive polyimide according to claim 1, wherein the tetracarboxylic acid dianhydride is a dicarboxylic anhydride having a 2,5-dioxotetrahydrofuryl group as one acid anhydride group.

7. A photosensitive polyimide according to claim 1, wherein the polyimide is used as a negative-working photosensitive resin.

* * * * *